United States Patent
Rehlander

[11] Patent Number: 6,084,182
[45] Date of Patent: *Jul. 4, 2000

[54] BACKPLANE STIFFENER

[75] Inventor: Richard N. Rehlander, Billerica, Mass.

[73] Assignee: Hybricon Corporation, Ayer, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/835,348

[22] Filed: Apr. 7, 1997

[51] Int. Cl.[7] ............................... H05K 1/00; H01B 7/00
[52] U.S. Cl. ............................................ 174/250; 174/135
[58] Field of Search ..................................... 174/135, 250, 174/254; 361/748, 749, 775, 807, 809; 439/67, 77

[56] References Cited

U.S. PATENT DOCUMENTS

| | | | |
|---|---|---|---|
| 3,341,742 | 9/1967 | Klehm, Jr. | 361/749 |
| 4,988,577 | 1/1991 | Jamieson | 428/573 |
| 5,198,279 | 3/1993 | Beinhaur et al. | 428/99 |
| 5,378,545 | 1/1995 | Akulow | 428/573 |
| 5,696,353 | 12/1997 | Kanno | 174/254 |
| 5,748,114 | 5/1998 | Koehn | 341/22 |

FOREIGN PATENT DOCUMENTS 1083000 9/1967 United Kingdom .

OTHER PUBLICATIONS

IBM Technical Disclosure Bulletin, "Guide Pin Stiffener Bar", vol. 37, No. 04A, p. 135, Apr. 1994.

Machine Design, D.S. Steinberg, "Taking the Shake out of Circuit Boards", vol. 49, No. 21, pp. 96–99, Sep. 22, 1977.

IBM Technical Disclosure Bulletin, "Sandwiched Backplane Between Conductive Stiffeners", vol. 37, No. 04A, pp. 401–401, Apr. 1994.

Primary Examiner—Kristine Kincaid
Assistant Examiner—Mark Olds
Attorney, Agent, or Firm—Samuels, Gauthier & Stevens LLP

[57] ABSTRACT

A backplane stiffener mounts in a channel defined between parallel rows of connectors on a backplane. In a first embodiment, the stiffener has a substantially U-shaped cross section and has a maximum width less than the width of the channel. The sidewalls are parallel and linear throughout the length of the stiffener. A second embodiment is adapted for use in "dog-legged" connector channels wherein at least one of the connectors in the row is wider than or spatially offset from the remaining connectors. The stiffener is preferably formed from a sheet of pliable material, for example sheet metal which is manipulated to form various features and folded longitudinally to form a rigid member. Rigidity is enhanced in an economic manner which does not interfere with backplane operations.

31 Claims, 11 Drawing Sheets

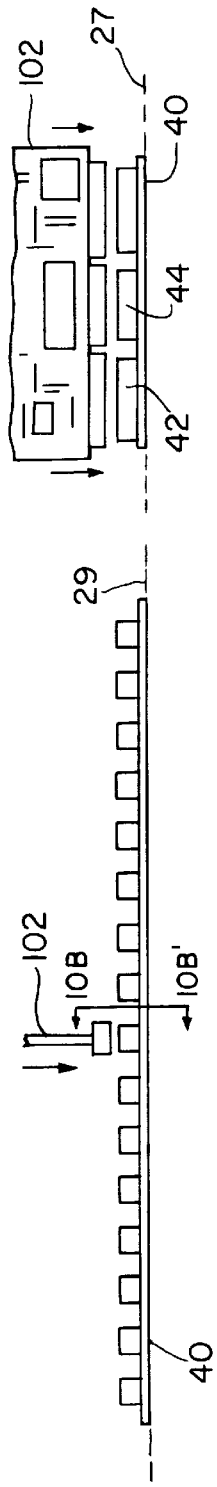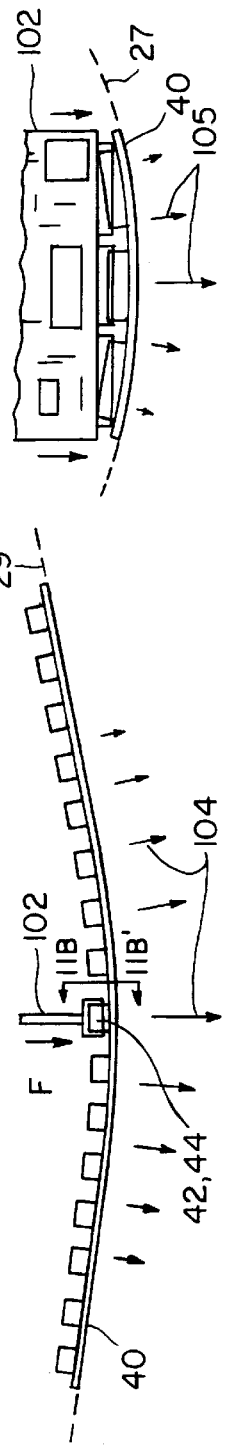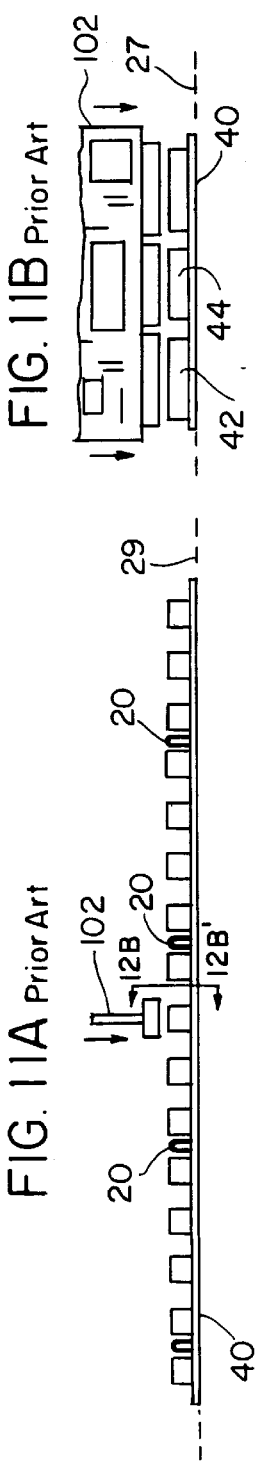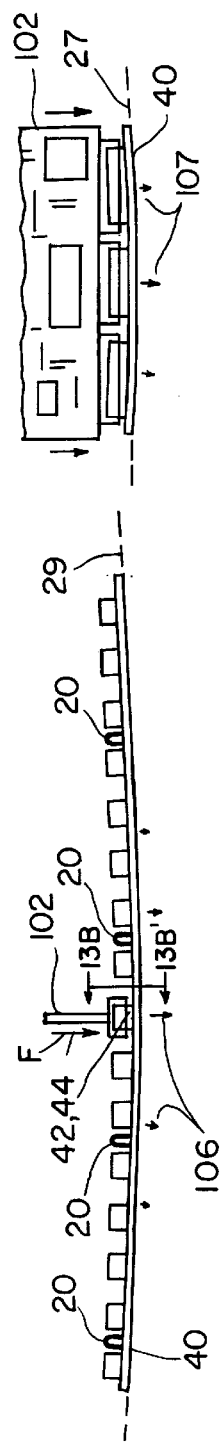

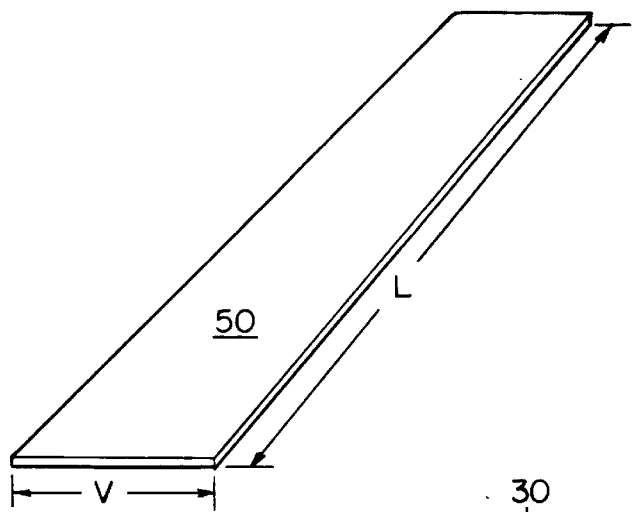
FIG. 14A
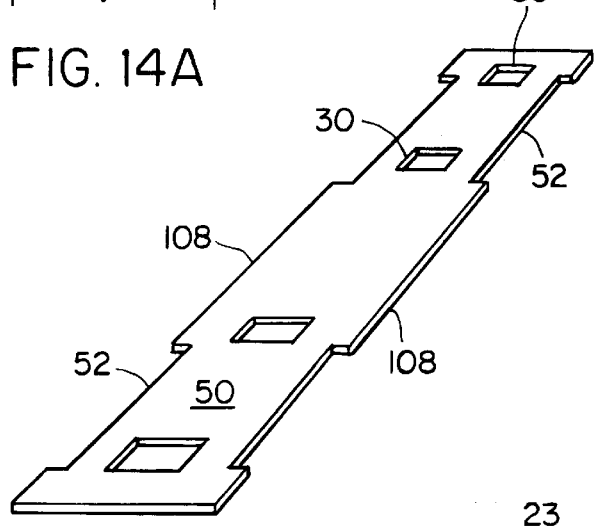
FIG. 14B
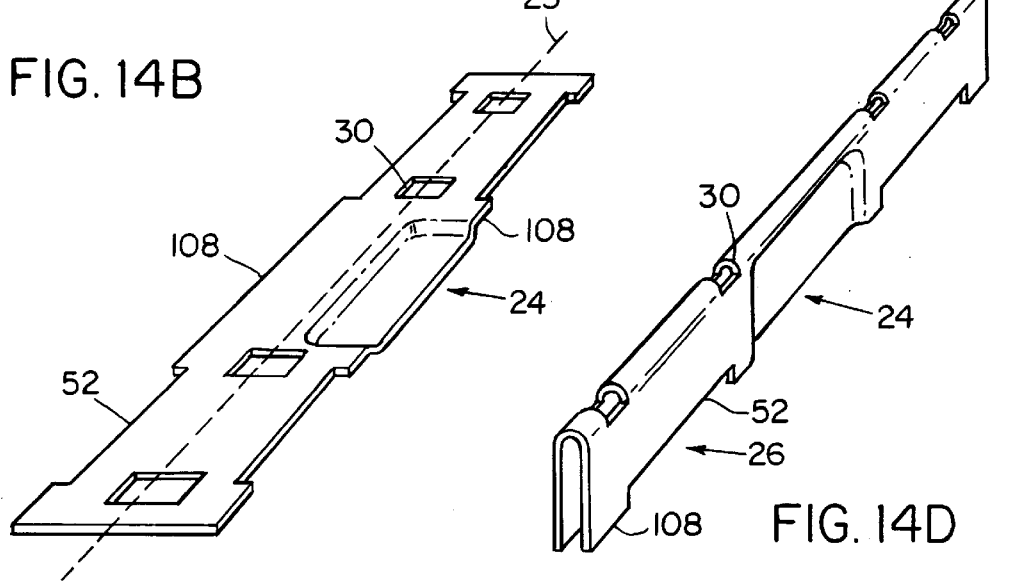
FIG. 14C
FIG. 14D

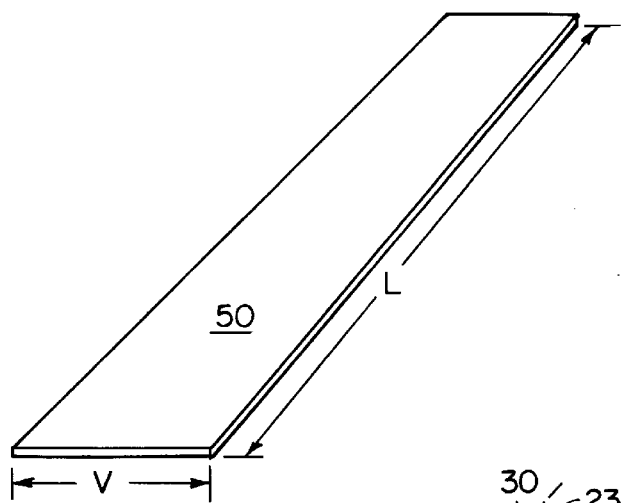
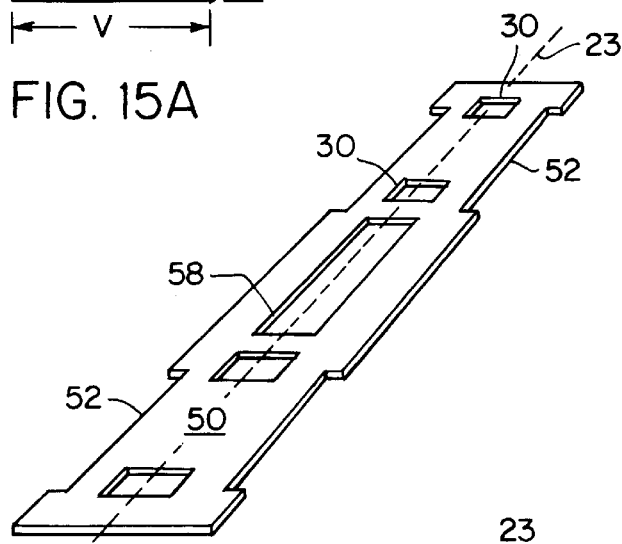
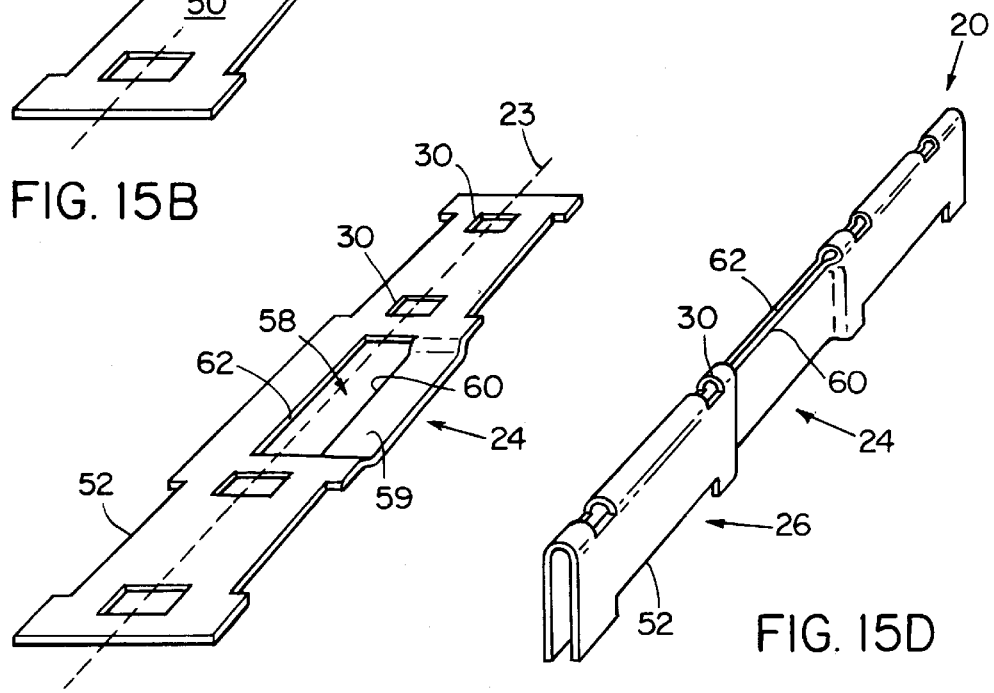

BACKPLANE STIFFENER

BACKGROUND OF THE INVENTION

Modern backplanes, also referred to as motherboards, serve as a communication medium for the exchange of electronic signals between a plurality of daughter cards. Each daughter card generates communication signals, for example data bus signals, address bus signals, and control signals. The signals are distributed to connectors mounted along a side of the daughter card. The daughter card connectors mate with a corresponding set of connectors on the backplane for providing interconnect and distribution of the signals between daughter cards along various communication paths on the backplane.

A chassis houses the backplane, daughter cards, and corresponding connectors. Backplane connectors are spaced in equidistant rows along the backplane, each row defining a card slot. Card guides mounted along the side of the chassis guide the daughter cards into alignment with corresponding backplane card slots. This assures proper mating of the daughter card and backplane connector pairs in each slot.

Each connector pair includes a plurality of interconnects in the form of conductive mating pins and terminals which couple by frictional contact. The plastic connector units housing the mating pins and terminals also exhibit inherent coupling friction. Consequently, a certain amount of coupling force is required to overcome the coupling friction for mating each connector. With several connectors on each daughter card, all simultaneously inserted into corresponding backplane connectors in a card slot, this coupling force can add up to a significant amount. For example, some connector configurations can require 80–100 ft-lbs of force for joining a daughter card to a backplane. The coupling force increases as the interconnect count increases.

Extractors and inserters mounted on an edge of the daughter card opposite the connector edge are often employed to serve as levers for generating the requisite coupling force. Any coupling force applied to the daughter card translates directly through the card slot connectors to the backplane. The side edges of the backplane are bolted to the chassis with bolts. With coupling force applied to the center of the backplane by the daughter card, and an equal and opposite force applied to the edges of the backplane by the chassis, the backplane is subject to a torque or bending moment. This in turn causes a deflection or bowing of the backplane. Bowing is undesirable because any bending moments may cause damage to the surface and/or inner layers of the backplane. In addition, any play in the backplane can inhibit proper mating between the daughter card and backplane connectors.

To mitigate the effects of deflection, backplanes often include structures for resisting longitudinal and lateral flexibility. Longitudinal backplane rigidity, along the major backplane axis perpendicular to the card slots, is generally provided by the backplane mounting bolts used for mounting the backplane to the chassis. Lateral backplane rigidity along the minor backplane axis parallel to the card slots, is often provided by rigidity enhancers laterally or longitudinally disposed across the center of the backplane. These rigidity enhancers have taken on various forms in the past.

A popular embodiment employs extrusion bars mounted laterally and/or longitudinally across the backside of the backplane and fixed to the backplane chassis. This provides a rigid support structure to resist backplane deflection. In backplane configurations with densely-populated components, extrusion bars interfere with the components. To overcome this problem, standoffs are used to distance the extrusion bar from the backplane such that the extrusion bar suspends over the components between contact points. Another popular method involves increasing the thickness of the backplane by adding backplane layers or by increasing the thickness of each individual layer. A thicker backplane is inherently more rigid.

Modern backplane configurations require ever-increasing daughter card interconnect capabilities due to wider communication busses and increased data throughput. This results in increased connector density, with higher connector pin counts, placing further demands on backplane rigidity. In some backplane configurations, the backplane surface is populated with connectors and surface-mount components to the extent that standard laterally-oriented stiffeners and/or extrusion bars cannot be applied to the backplane in an economically feasible manner. As an example, the VME 64 Extension backplane configuration includes three connectors of high pin density in each card slot. To further increase interconnect, the space between the outer and middle connectors in each card slot is minimized and consequently will not accommodate a longitudinally-disposed stiffener structure of sufficient strength.

To complicate matters, the middle connector and outer connectors are laterally offset from each other in some configurations, for example VME 64 Extension configurations. Offset connector arrangements can result from the connectors being of various widths, or from the connectors being spatially shifted within a card slot. In any event, such offset configurations result in a non-linear "dog-legged" channel between rows of connectors. The term "dog-legged" as used herein is intended to mean a channel, one or more portions of which are offset, displaced, or misaligned with respect to other portions, i.e. a channel including an abrupt bend, in which one channel section is turned out of line, but nearly parallel with other channel sections. "Dog-legged" also refers to a portion of a stiffener interposed in such a channel. Such "dog-legged" channels prevent insertion of standard prior art linear stiffeners and extrusion bars. To date, the problem of stiffening a backplane having "dog-legged" connector channels has not been addressed, other than stiffening by adding thickness to the construction of the backplane, which in turn increases manufacturing costs.

SUMMARY OF THE INVENTION

To overcome the limitations of the prior art, the present invention is directed to method and apparatus for enhancing backplane rigidity with rigid backplane stiffeners adapted to mount directly on a backplane surface in channels defined between adjacent parallel rows of connectors. The stiffeners resist any lateral deflection of the backplane during insertion of a daughter card and dampen backplane vibration during operation. An alternative embodiment of the rigidity enhancer, or stiffener apparatus is adapted for backplane configurations having dog-legged connector channels.

The apparatus of the invention is directed to a backplane stiffener adapted to be interposed in a channel of width w and depth z between two substantially parallel rows of connectors mounted to a backplane. The stiffener comprises first and second side walls, and an arcuate member. Each side wall has a base, a top edge, an inner surface, and an outer surface. The arcuate member has first and second ends which are rigidly coupled to the top edges of the first and second sidewalls respectively in such a manner that the opposed outer surfaces of the sidewalls are parallel and spaced apart a distance d which is less than the width w of the channel.

In a preferred embodiment, the combined height h of the sidewalls and arcuate member is approximately equal to or less than the depth z of the channel to avoid interference between the stiffener and an adjacent connector. The inner surfaces of the sidewalls are preferably spaced apart a distance s sufficient to accommodate bolts of a diameter less than s for mounting the stiffener to the backplane. The arcuate member and/or sidewalls include apertures for securing nuts used for fastening the stiffener to the backplane. A portion of the stiffener may have opposed outer surfaces of a distance less than d apart such that the stiffener is adapted for application in a dog-legged channel. The apparatus may further comprise a backplane having rows of parallel connectors which define channels therebetween and further including mating bolts and nuts for mounting the stiffener to the backplane, the bolts passing through pre-drilled mounting holes in the backplane.

The apparatus of the invention is further directed to a stiffener adapted to be interposed between two substantially parallel rows of connectors mounted to a backplane in a dog-legged arrangement. The stiffener comprises first and second linear portions and a dog-leg portion. The first and second linear portions have respective first and second longitudinal center axes. The dog-leg portion rigidly couples the first and second linear portions such that the respective longitudinal center axes are parallel and offset by a distance d.

In a first embodiment, the first and second linear portions have respective widths which are different. Each linear portion includes first and second corresponding side faces. In a preferred embodiment, a first side face of the first member is aligned with a first face of the second member.

In a second preferred embodiment of the apparatus, the stiffener further comprises a third linear portion and a second dog-leg portion. The third linear portion has a third longitudinal center axis. The second dog-leg portion rigidly couples the second linear portion to the third linear portion such that the first and third longitudinal axes are substantially parallel and aligned.

Enhancements to the present invention include a nut trap formed on a top surface of the stiffener for receiving a nut. The nut trap operates as an integrated wrench for securing the nuts as the stiffener is mounted to the backplane with corresponding bolts. The first and second linear portions are preferably of the height less than the height of an adjacent connector to avoid interference with an inserted daughter card. The stiffener may be formed of a material selected from the group consisting of aluminum, steel, plastic, and graphite, in addition to other rigid materials.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

Prior art FIGS. 10A–10B are front and side views respectively of a daughter card being mounted to the backplane.

Prior art FIGS. 11A–11B are exaggerated corresponding front and side views respectively of the resultant bowing of the motherboard due to insertion of the daughter card.

FIGS. 12A–12B are front and side views respectively of a daughter card being mounted to a backplane having stiffeners mounted thereon in accordance with the present invention.

FIGS. 13A–13B are exaggerated corresponding front and side views of the resulting diminished bowing as a result of the stiffeners.

FIGS. 14A–14D are sequential illustrations of a first preferred method for forming a backplane stiffener in accordance with the present invention.

FIGS. 15A–15D are sequential illustrations of a second preferred method for forming a backplane stiffener in accordance with the present invention.

DETAILED DESCRIPTION OF PREFERRED EMBODIMENTS

Figure 1:
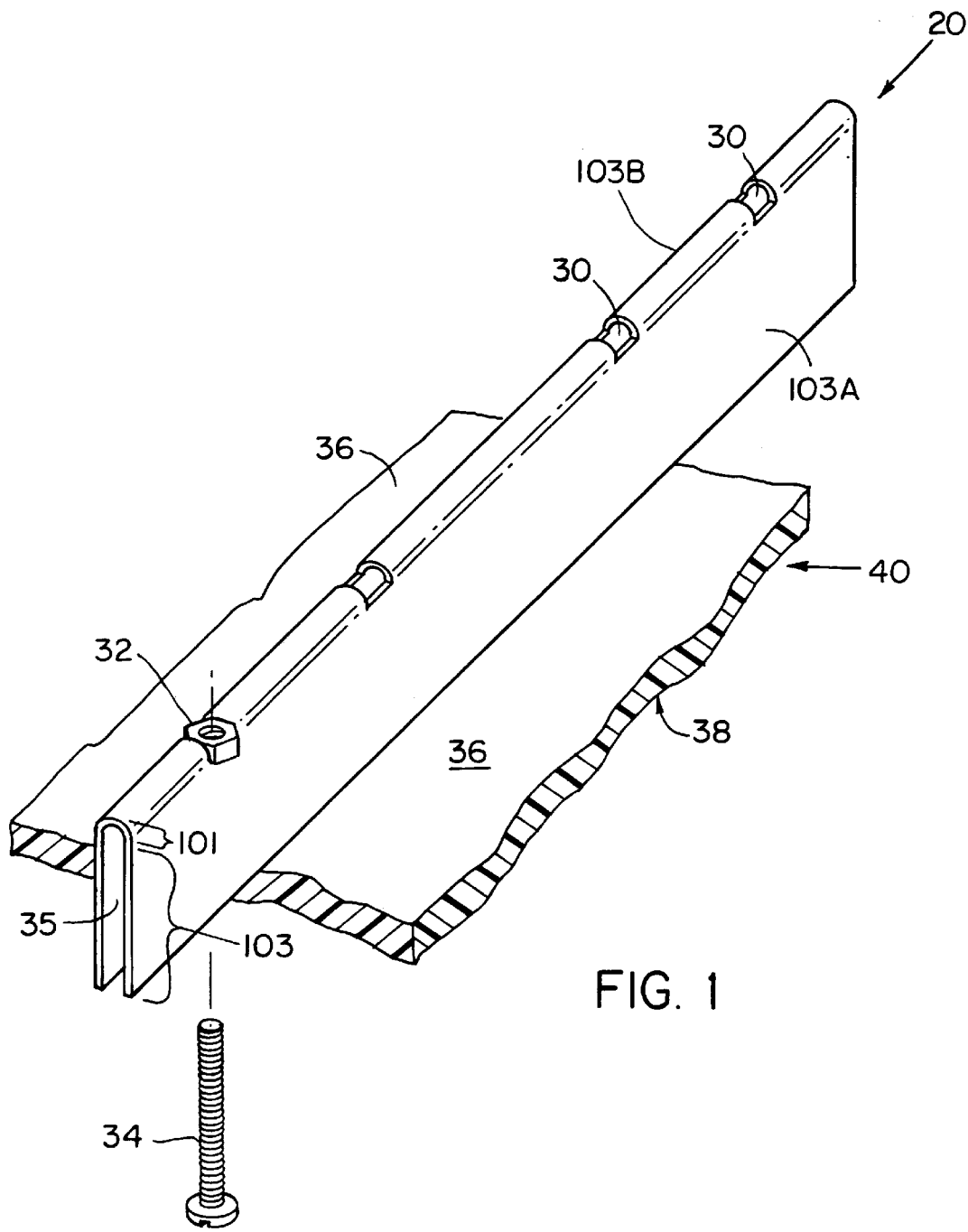
FIG. 1 is a perspective view of a backplane stiffener in accordance with a first preferred embodiment of the present invention.

FIG. 1 is a perspective view of a first preferred embodiment of the present invention. The backplane stiffener 20 of the present invention is a rigid structure formed generally in a "U"-shape from a sheet of pliable material, for example sheet metal. The sheet metal is folded in half to form a rigid structure, as will be described below. Once folded, the rigid structure 20 includes an arcuate portion 101 at its top, and a wall portion 103 comprising first 103A and second 103B sidewalls at its base.

Figure 4:
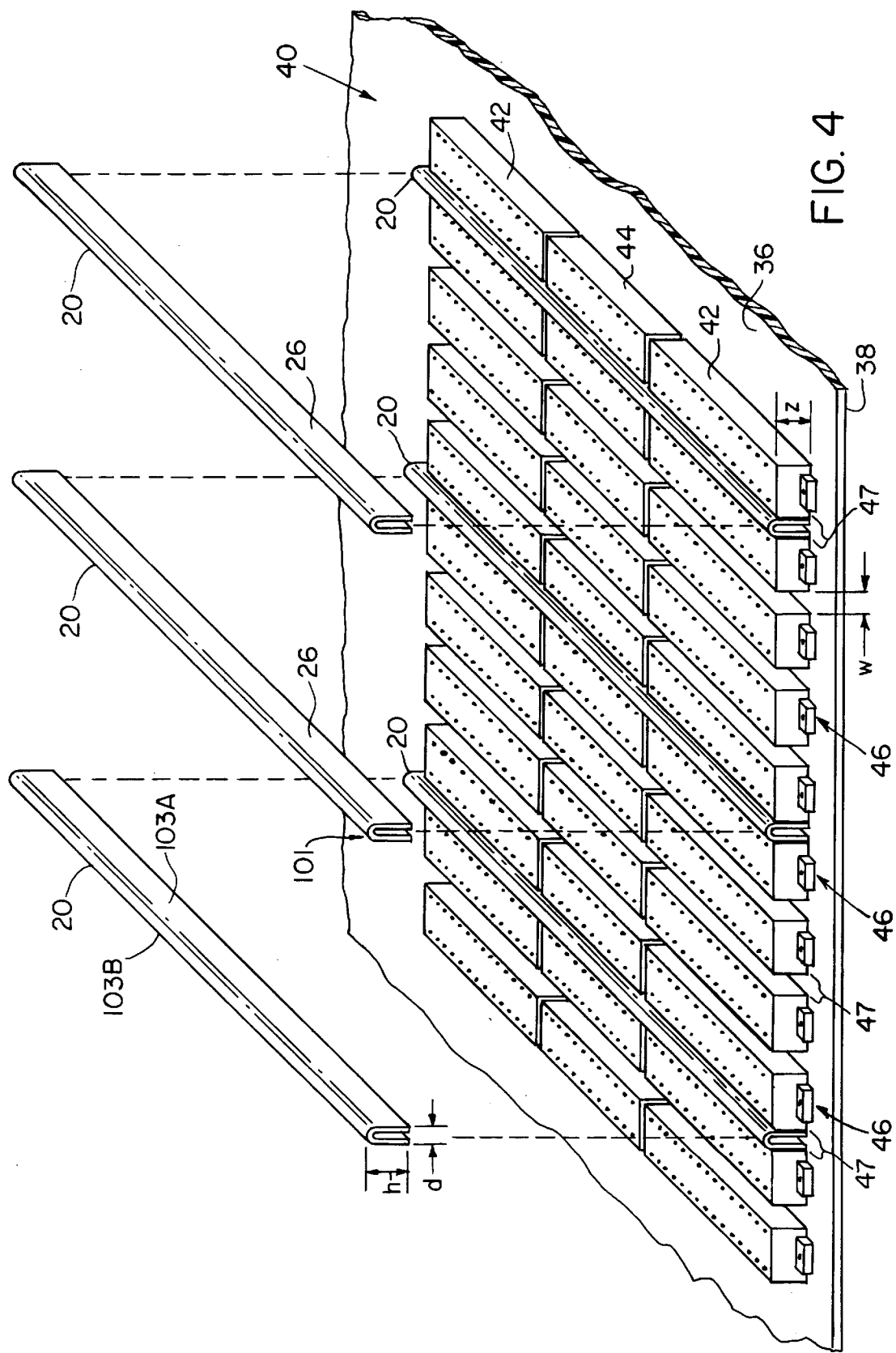
FIG. 4 is an exploded perspective view of a plurality of backplane stiffeners shown in FIG. 1 applied to a backplane in accordance with the present invention.

The stiffener 20 is adapted to be mounted on the component surface 36 of a backplane 40 in a channel 47 defined between parallel rows 46 of connectors 42, 44 as shown in FIG. 4. In an alternative embodiment, the stiffener 20 may be mounted to the back side 38 of the backplane 40. Mounting the stiffener 20 on the component side 36 is generally preferred for avoiding interference with metal runs and solder joints on the back side 38 of the backplane 40.

In FIG. 4 a plurality of stiffeners 20 are mounted to the component side 36 of a backplane 40. Several connectors 42, 44 are soldered to the backplane in rows 46, which in turn define the backplane card slots for mating with inserted daughter boards. In standard backplanes, such as the one shown in FIG. 4, the rows 46 of connectors 42, 44 are generally parallel, and therefore define linear channels 47 of width w and depth z therebetween. These linear channels 47 in turn accommodate stiffeners 20 having parallel sides as shown. Opposed outer surfaces 103A, 103B of the sidewalls are preferably a distance d apart where d is less than the width w of the channel. In a preferred embodiment, the combined height h of the sidewalls 103A, 103B and the arcuate member 101 is approximately no greater than the depth z of the channel 47 to avoid interference with an adjacent connector of an inserted daughter card.

Figure 2:
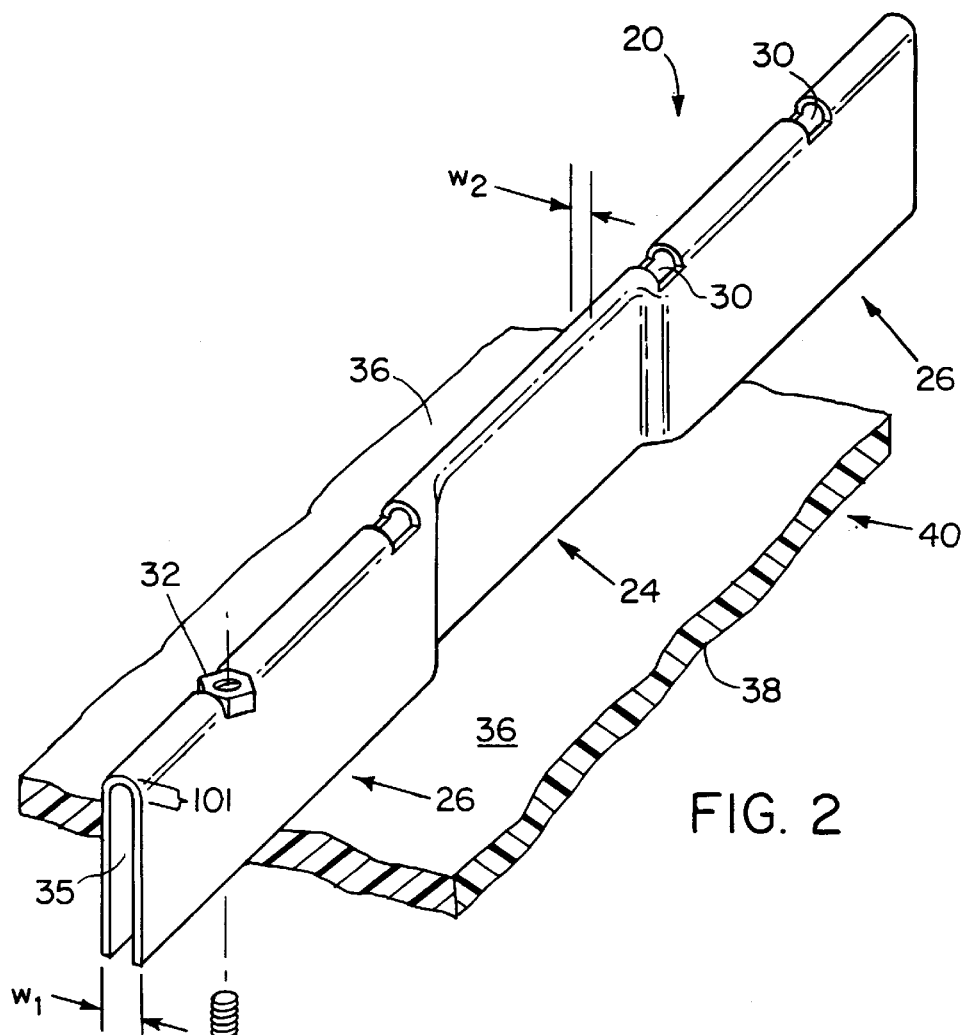
FIG. 2 is a perspective view of a backplane stiffener in accordance with a second preferred embodiment of the present invention.

FIG. 2 is a perspective view of a second preferred embodiment of the present invention. In this embodiment, the rigid stiffener 20 includes at least one standard portion 26 of a standard width $W_1$ and at least one reduced portion 24 of reduced width $W_2$. The standard portions 26 of standard width $W_1$ are adapted to fit between and parallel to connectors 42, 44 (see FIG. 2) of adjacent rows 46 mounted on the component side 36 of the backplane 40. As described above, certain types of backplane configurations include connector rows which define non-linear channels therebetween. The embodiment of FIG. 2 is adapted for such an arrangement. Any deviation from channel linearity is referred to herein generally as a "dog-legged" channel or connector configuration. To accommodate such configurations, the present invention includes a reduced region 24 of reduced width $W_2$ adapted to fit between adjacent connectors in the dog-legged portion of the channel.

Figure 5:
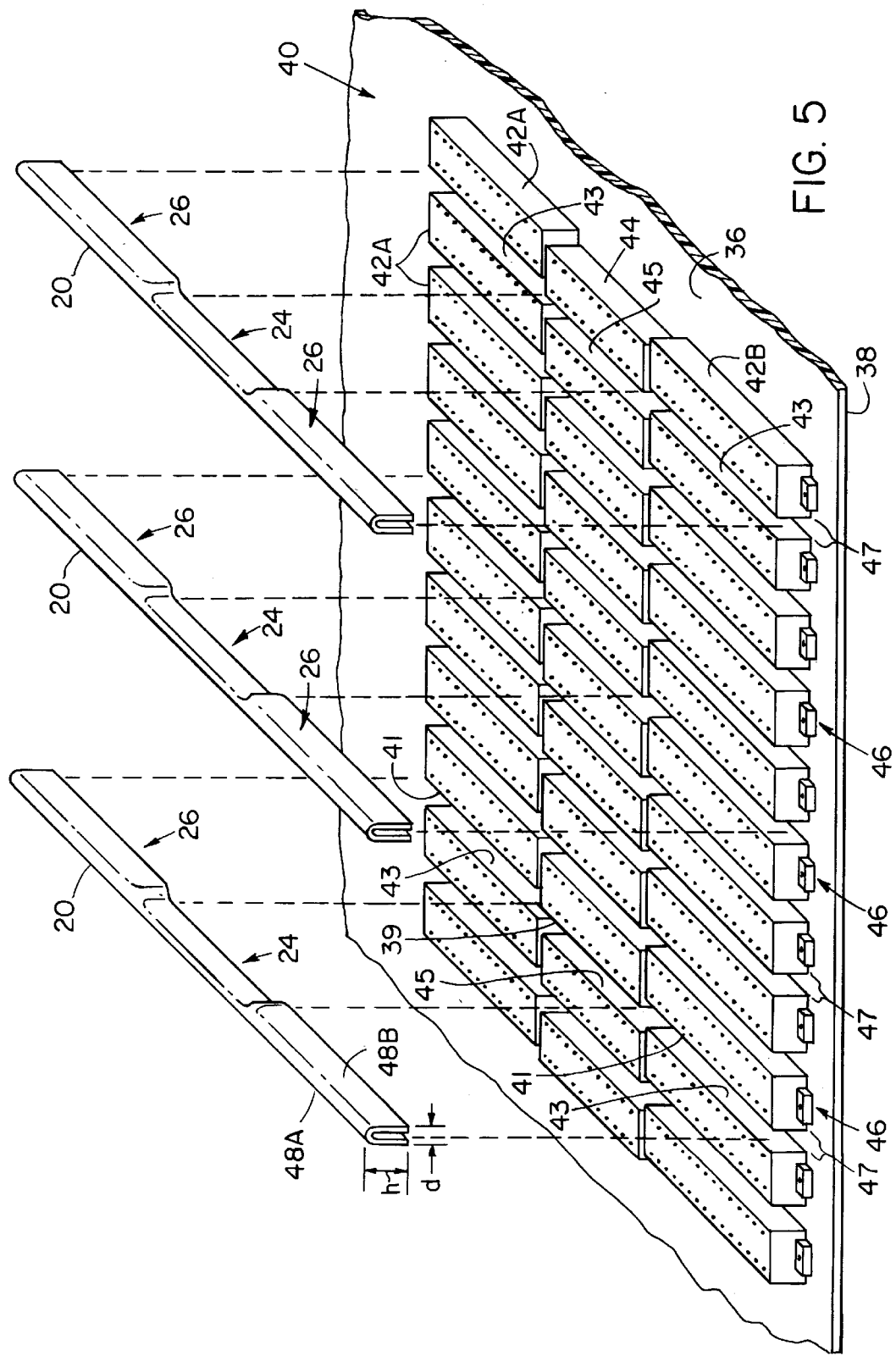
FIG. 5 is an exploded perspective view of a plurality of backplane stiffeners applied to a backplane in accordance with the present invention.

In the backplane configuration illustrated in FIG. 5, the connector rows 46 include a spatially offset arrangement of connectors, due to the expanded width and/or shifting of the middle connectors 44 relative to the other connectors 42. This offset connector arrangement forms dog-legged channels 47 between connector rows 46. Such dog-legged channels 47 would not accommodate linear stiffeners of the prior art. The stiffener 20 of the present invention solves this problem by conforming to the non-linear portions of the channel as shown.

In the embodiment of FIG. 5, a first side 48A of the stiffener 20 is linear and generally borders a first side face 43 of the outer connectors 42 while being spaced from the first side face 45 of middle connectors 44. The second side 48B of the stiffener 20 borders a second side face 41 of the outer connectors 42A, 42B and a second face 39 of the middle connectors 44 in the dog-legged region of the channel. Note that the first side 48A of the stiffener 20 may be formed with a bulge to conform with the first face 45 of the middle connectors 44, in which case, the two sides 48A, 48B of the stiffener 20 would be generally parallel along its length and have a spatially-offset portion 24 in the center.

Figure 6:
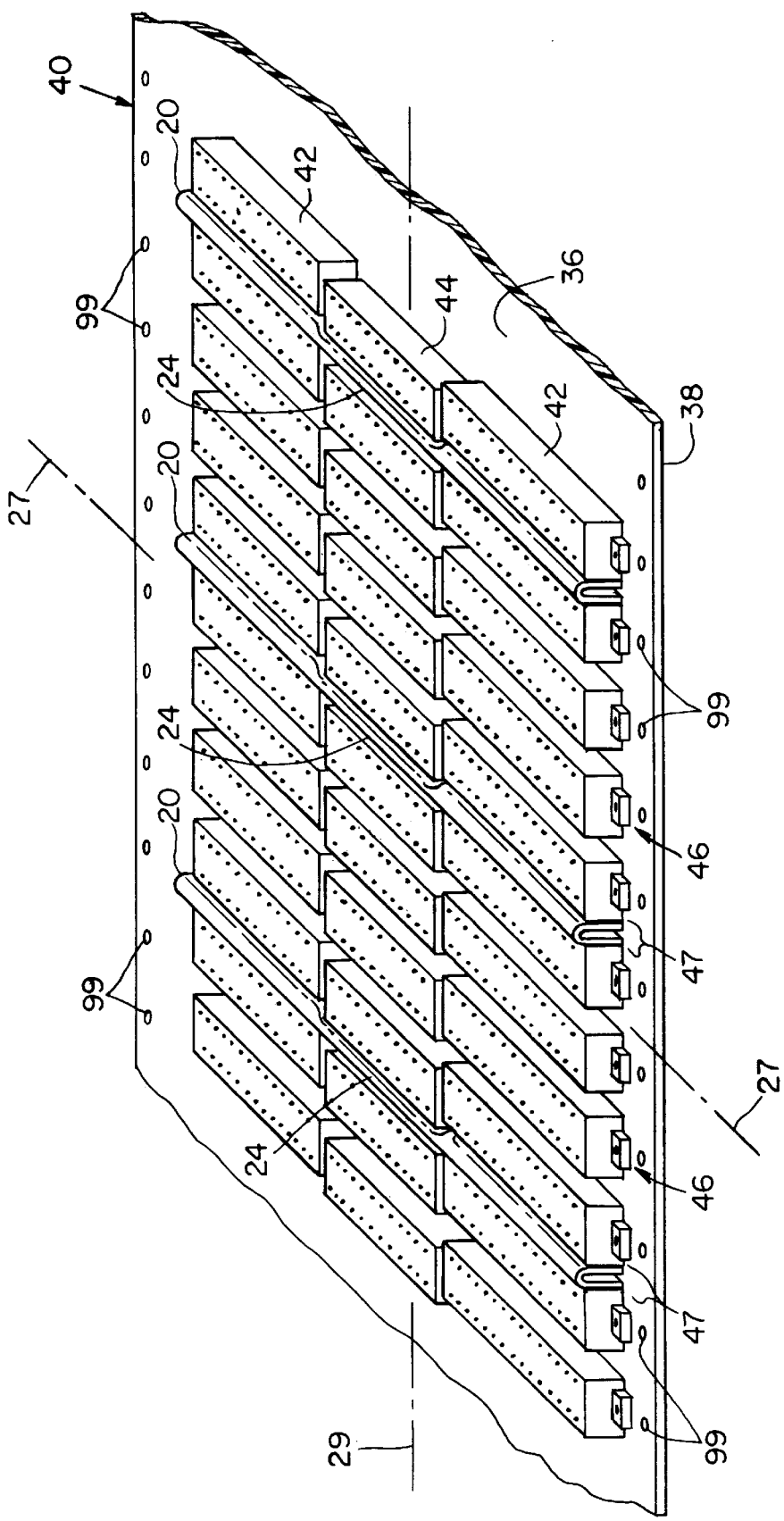
FIG. 6 is a perspective view of the configuration resulting from FIG. 5 in accordance with the present invention.

FIG. 6 is a perspective view of a plurality of stiffeners 20 mounted to the component side 36 of the backplane 40. The stiffeners 20 are mounted in the dog-legged channels 47 between rows 46 of adjacent connectors 42, 44. The portions of reduced width 24 align with a side surface of the center connectors 44 offset from the outer connectors 42. The mounted stiffeners 20 are of a height such that they do not interfere with daughter card insertion. As the daughter card is mounted, the stiffeners provide lateral rigidity along axis 27 and provide a a certain amount of longitudinal rigidity along axis 29. A substantial amount of longitudinal rigidity is provided by backplane mounting bolts which mount the backplane to the chassis at holes 99. The lateral and longitudinal rigidity of the backplane in turn mitigates and/or eliminates backplane deflection, as described above.

Referring back to FIGS. 1 and 2, in a preferred embodiment, the stiffener 20 includes nut traps 30 adapted to receive a nut 32 used for mounting the stiffener 20 to the backplane 40. Bolt 34 pass through holes in the backplane 40, into a slot 35 in the stiffener 20, further through the nut traps 30 and engage with nuts 32 mounted in the traps 30. When the bolt is tightened, the force from the bolt threads is translated to urge the nut 32 against a top surface of the trap 30. This in turn locks the stiffener 20 against the component side 36 of the backplane 40.

Figures 3A, 3B:
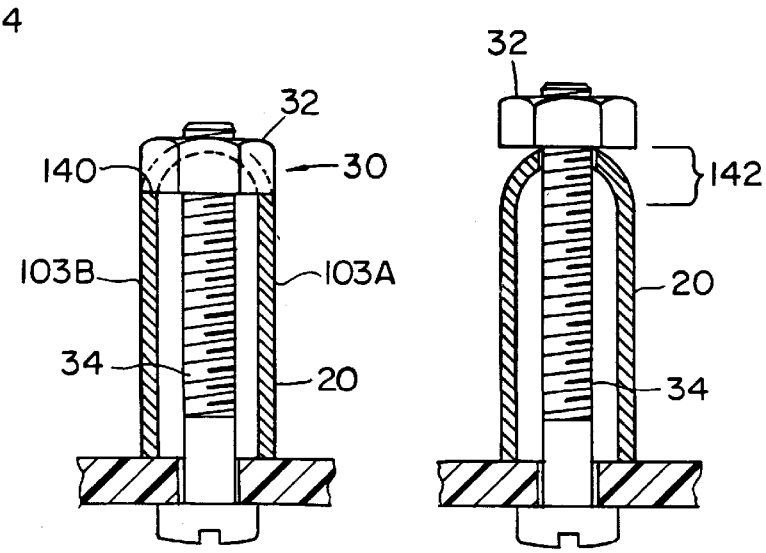
FIGS. 3A–3B are side cross-sectional views of the interface between the bolt, nut and stiffener in accordance with the present invention.

FIGS. 3A and 3B are cross-sectional views of the interaction of the bolt 34, nut 32, and stiffener 20. In FIG. 3A, the nut 32 rests on a top surface 140 of each sidewall 103A, 103B as shown in the embodiments of FIGS. 1 and 2. In the alternate embodiment of FIG. 3B, the nut trap apertures are formed such that the nut 32 rests on an arcuate portion 142 of the arcuate member. As the bolt 34 is tightened, the nut 32 is urged against the arcuate portion 142 which in turn operates as a lock washer. This locking feature enhances rigidity and reduces the loosening effects of vibration.

Figure 7:
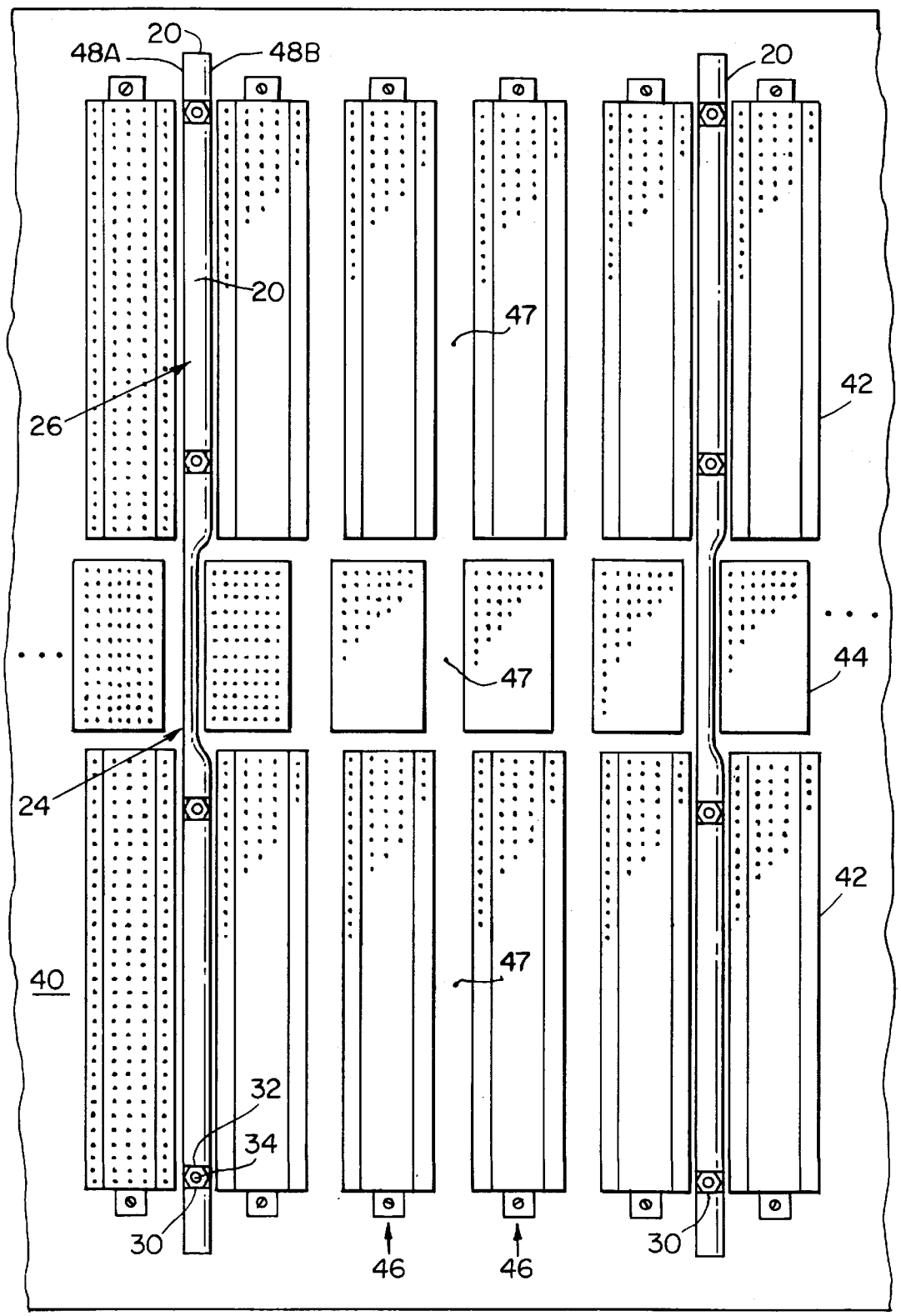
FIG. 7 is a top view of a section of the backplane of FIG. 6, illustrating a preferred embodiment of the present invention.

FIG. 7 is a top view of the mounted stiffeners 20 of FIG. 6. In this example, the stiffeners 20 are mounted to the backplane 40 with bolts 34 and nuts 32 secured in nut traps 30 as described above. The sides of the nut traps 30 operate as a wrench to secure the nut 32 while the bolt 34 is tightened. The bolt heads at the back side of the backplane avoid interference with shrouds or other forms of jumpers mounted on the rear of the backplane.

The backplane illustrated in FIG. 7 is a VME-64 Extension protocol backplane. The backplane is approximately 10.5 in. in height and its length depends upon the number of card slots mounted 0.8 in. apart. A typical backplane is formed of multiple layers, for example 10 layers, of G10 material, to a thickness of approximately 0.180 in. The outer connectors 42 comprise 5 row 2 mm connectors while the middle connectors 44 comprise 7-row 2 mm connectors. The VME-64 Extension connector configuration results in dog-legged channels 47 as shown. It can be seen that the stiffeners 20 include a first face 48A which is substantially straight or linear throughout its length, and a second face 48B which is non-linear, for conforming with the dog-legged section of the channel, as described above. The stiffener of the present invention is equally applicable to other conceivable dog-legged connector arrangements.

Figure 8:
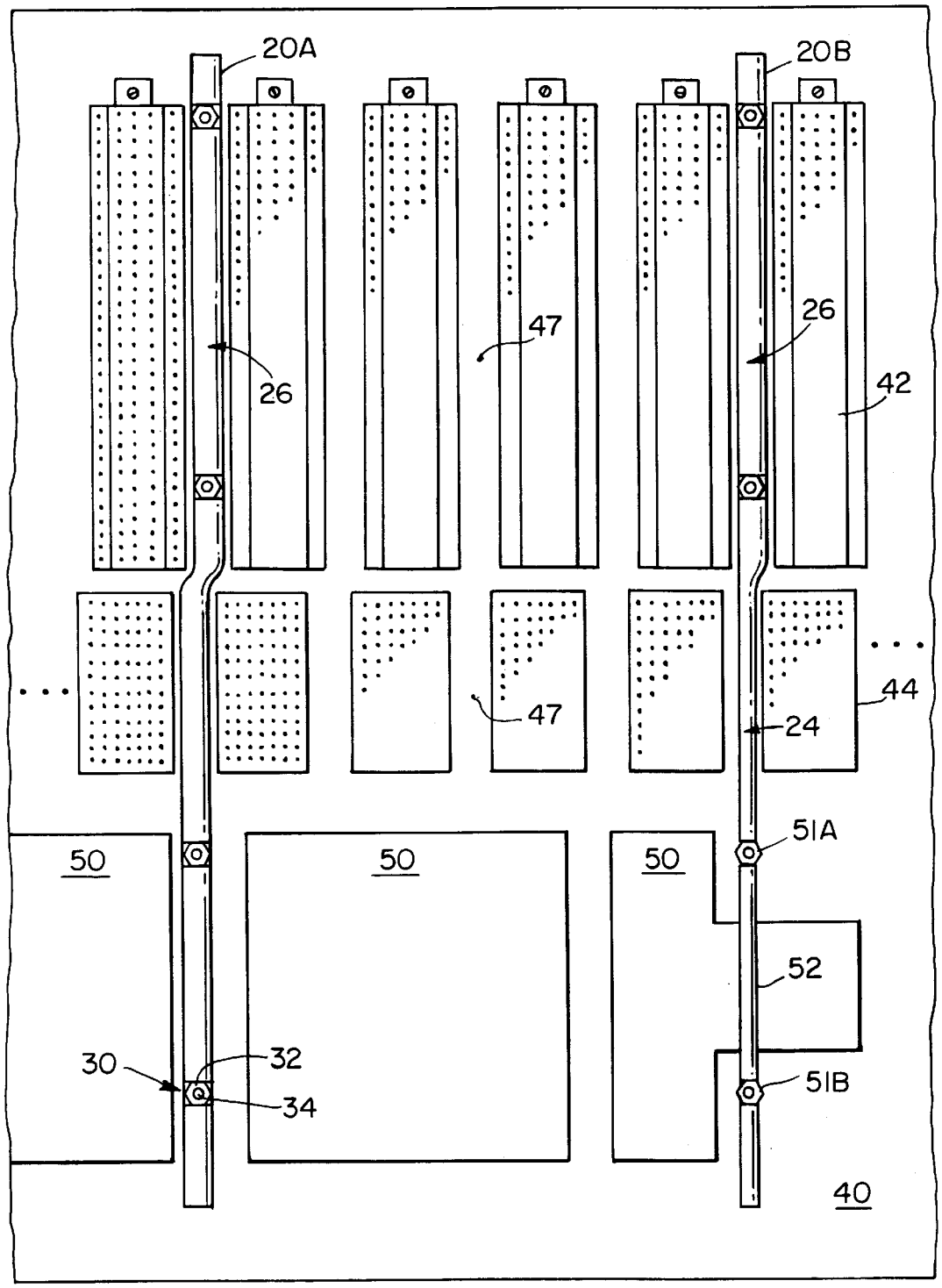
FIG. 8 is a top view of a section of the backplane of FIG. 6, illustrating alternative embodiments of the present invention.

FIG. 8 is a top view illustrating alternative stiffener embodiments 20A, 20B in accordance with the present invention. In the embodiments shown, the backplane 40 configuration includes a plurality of center connectors 44 and only a single group of outer connectors 42. The second group of outer connectors 42 shown in FIG. 7 is replaced by electronic circuit blocks 50, including components mounted on the backplane. In this example, stiffener 20B includes a region of standard width 26 adapted to interpose between adjacent outer connectors 42, and a region of reduced width 24 adapted to interpose between adjacent middle connectors 44. In this example, the stiffener 20 continues along the component block 50 area of the board and remains in reduced width as shown. Nuts 32 mounted in the nut traps 30 of the stiffener mate with bolts 34 for securing the stiffener 20B to the board. In this example, a riser 52 (also shown in FIGS. 14, 15) is formed in the stiffener 20 between adjacent mounting points 51A, 51B to avoid interference between the underside of the stiffener 20 and the component block 50 as shown.

A second stiffener embodiment 20A conforms with a the side surfaces of the middle connectors 44 and remains in standard width in the dog-legged region of the channel 47. This allows for a slight increase in backplane rigidity relative to stiffener 20B due to the increased width. Both examples of stiffeners 28A and 28B are applicable to the present invention.

Figure 9A:
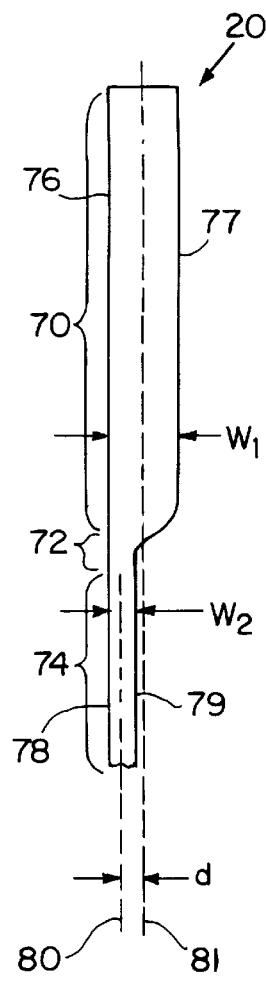
FIGS. 9A–9D are top views of various respective stiffener embodiments illustrating the first and second linear portions and the dog-leg portion in their respective spatial positions in accordance with the present invention.
Figure 9B:
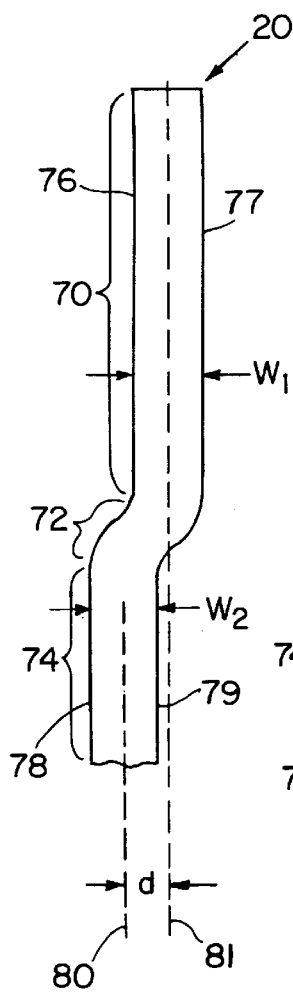

FIGS. 9A–9D are top views of various stiffener configurations in accordance with the present invention. In FIG. 9A, the stiffener 20 includes a first rigid linear portion 70 of width $W_1$ having a first center longitudinal axis 81, and a second rigid linear portion 74 of width $W_2$ having a second center longitudinal axis 80. A dog-leg portion 72 rigidly couples the first rigid linear portion 70 to the second rigid linear portion 74 in such a manner that the dog-leg portion 72 generally conforms to any bends in the dog-legged channel in which the stiffener is intended for use. In this arrangement, the center axis of the first portion 81 is offset a distance d from the center axis of the second portion 80, and the first width $W_1$ and second width $W_2$ are different. In addition, the first side face 76 of the first linear portion 70 is in alignment with the first side face 78 of the second linear portion 74.

In the embodiment of FIG. 9B, the stiffener again includes a first rigid linear portion 70 offset a distance d from the second rigid linear portion 74. However, their respective widths $W_1$, $W_2$ are substantially similar. None of the side faces 76, 77, 78, 79 are in alignment with other side faces in this embodiment.

Figure 9C:
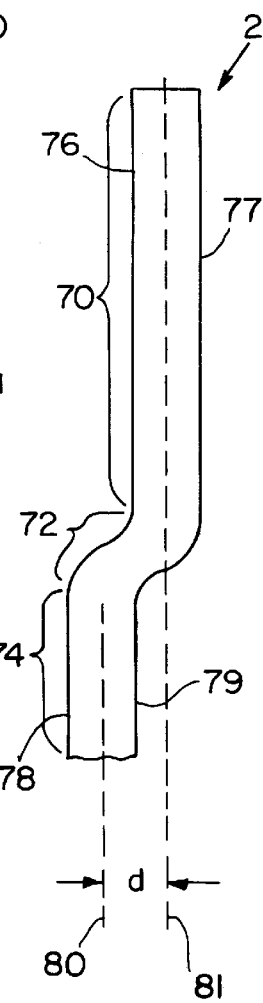

In FIG. 9C, the first 70 and second 74 linear portions are of the same width and offset a distance d. However, in this embodiment, the second side face 79 of the second portion 79 is in alignment with the first side face 76 of the first linear portion 70.

Figure 9D:
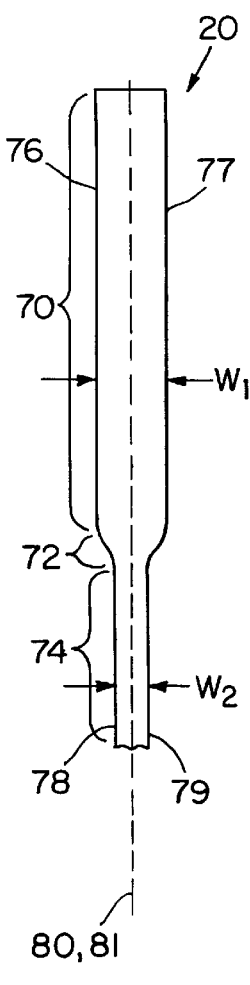

In FIG. 9D, the center axes of the first 70 and second 74 linear portions are of different widths $W_1$, $W_2$, and none of the side faces 76, 77, 78, 79 are in alignment. However, in this embodiment, the center axes 80, 81 of the linear portions are in alignment.

The above-described embodiments are merely illustrative of those suitable for carrying out the objectives of the present invention, and are not intended to represent a comprehensive and exclusive list of such embodiments.

FIGS. 10A and 10B are front and side views respectively of a daughter card 102 being inserted into a backplane 40 in accordance with the prior art. In FIG. 10A, before pressure is applied to the backplane 40, it is evident that the backplane is relatively flat along its longitudinal axis 29. Likewise, in FIG. 10B taken across section 10B–10B', the backplane is relatively flat along its lateral axis 27.

When the daughter card is inserted as shown in FIGS. 11A and 11B, the coupling force F required for mating the daughter card 102 with the backplane 40 is incident on the connectors 42, 44. This force F is translated through the connectors 40 and causes a longitudinal deflection of the backplane 40 as illustrated by arrows 104 in FIG. 11A and lateral deflection of the backplane 40 as illustrated by arrows 105 in FIG. 11B. The deflection 104, 105 is larger in the center of the backplane than on its sides and is more pronounced along the lateral axis 27 than along the longitudinal axis 29. The backplane is stronger longitudinally because it is supported on its sides by the chassis at mounting holes 99 as described above.

FIGS. 12A and 12B correspond to FIGS. 10A and 10B. However, in FIGS. 12A and 12B, the backplane 40 is reinforced by stiffeners 20 as described above. The stiffeners provide lateral rigidity to the backplane, in addition to a certain amount of longitudinal rigidity. It can be seen in FIGS. 13A and 13B, corresponding to FIGS. 11A and 11B that longitudinal deflection 106 and lateral deflection 107 is diminished as a direct result of the addition of stiffeners 20.

As stated above, it is common in a VME 64 Extension configuration for the daughter card coupling force to be upwards of 80 to 100 ft-lbs. This can cause deflection in an unsupported backplane of approximately 0.030" in the vicinity of the card slot. With the need to align hundreds of accurately machined pins, a deflection of this magnitude is mechanically unacceptable as many of the pins may fail to fully connect. The present invention reduces the deflection to less than 0.015", an acceptable amount, in an efficient and economic manner which does not interfere with backplane components.

After the daughter cards are inserted and the backplane is in operation, the unsupported backplane may vibrate due to externally-induced forces, causing the connector contacts to rub against each other, which in turn wears down the finish metal on the interconnects. As a result, contacts can momentarily become separated, introducing noise or other intermittent errors into the system. Connectors are rated for a certain number of insertion and removal cycles, for example 500 cycles. Vibration can wear the contacts against each other as if undergoing insertion/removal cycles at high rates., accelerating connector fatigue. Vibration further harms the solder joints and conductive runs on the backplane. The present invention dampens vibration in the operational backplane to acceptable levels to avoid or mitigate this problem.

FIGS. 14A–FIG. 14D are sequential illustrations of a first preferred method for forming the stiffener 20 of the present invention. In FIG. 14A, a rectangular sheet of a pliable material, for example sheet metal 50 is formed of length L equal to the length of the stiffener to be formed and of width v equal to approximately ½ the height of the stiffener to be formed. In FIG. 14B, nut trap apertures 30 and risers 52 are punched or otherwise formed in the sheet metal 50. The risers 52 allow for the stiffener 20 to be mounted to the backplane 40 without interfering with any components or conductive paths running underneath the stiffener in the region of the risers 52. The nut trap apertures 30 will eventually form nut traps for mounting the stiffener 20 to the backplane 40 without the need for a wrench for securing the nut during tightening. In FIG. 14C, an indentation 24 is pressed in the stiffener. This indentation 24 will serve as the region of reduced width for conforming to the side of the offset middle connector row. This is apparent in FIG. 14D where the stiffener 20 is folded along axis 23 to create the rigid U-shaped stiffener configuration as shown. Note that in FIG. 14D, the sides 108 of the original sheet have become the base surfaces of the stiffener. By folding the stiffener lengthwise as shown, a substantially rigid member is formed from a formerly pliable member.

FIGS. 15A–15D are sequential illustrations of a second preferred embodiment of a stiffener 20. In FIG. 15A, a sheet 50 of metal is formed of length L and of width v as described above. In FIG. 15B, nut trap apertures 30 and risers 52 are formed in the sheet metal 50 as described above. An additional aperture 58 is formed in the center of the sheet 50 along axis 23. In FIG. 15C, an indentation 59 is pressed in the metal. Note that in this sequence, the indentation 59 is pressed with the benefit of having no material along its inner edge 60. In FIG. 15D, the stiffener 20 is folded along axis 23. In this embodiment, the top surface of the stiffener 20 in the region of reduced width 24 is defined by the inner sides 60–62 (see FIG. 15C) of the aperture 58. The embodiment of FIG. 15D is easier to manufacture than the embodiment shown in FIG. 14D as less precision is required to form the impression 59 in the region of reduced width because the impression 59 is made with the benefit of the aperture 58 along its inner edge 60.

In alternative embodiments, the stiffener may be die-cast, routed or otherwise formed. The stiffener may be formed of sheet metal, solid metal, plastic, graphite, fiberglass, or any material well suited for stiffening the backplane. The stiffeners may be mounted on the rear side of the backplane in some situations, however most protocols require the rear side of the backplane to be of low profile so as not to interfere with the rear of the chassis. In general, the height of the stiffener should be approximately even in height or less than the height of adjacent connector sockets. Folding the stiffener as shown in FIGS. 14D and 15D increases the strength of the stiffener and in addition serves the purpose of forming an alignment region for aligning the bolts with the nut traps. The stiffeners 20 are preferably mounted to the backplane 40 by any of a variety of methods including bolts, epoxy, and cement.

While this invention has been particularly shown and described with references to preferred embodiments thereof, it will be understood by those skilled in the art that various changes in form and details may be made therein without departing from the spirit and scope of the invention as defined by the appended claims.

I claim:

1. The combination of a backplane having at least a pair of substantially parallel rows of connectors thereon, and a stiffener mounted between said rows of connectors, said stiffener comprising a rigid elongated member, the section across the longitudinal axis of said member being substantially U-shaped, said member comprising first and second side walls, each of said side walls having a base, a top edge, an inner surface, and an outer surface;

an elongated arcuate portion having first and second elongated edges rigidly coupled to the top edges of said first and second side walls respectively, the inner surfaces of the side walls being parallel, opposed and spaced apart; and fastener means for mounting said member to said backplane;

said member further comprising a plurality of spaced-apart apertures extending through the apex of said arcuate portion, said each of said apertures adapted to prevent rotation within said each of said apertures of said fastener means.

2. The combination as set forth in claim 1 wherein said fastener means comprises a plurality of bolts each of a diameter adapted to extend through said apertures and between said side walls, said inner surfaces of said side walls being spaced apart a distance greater than said diameter so as to accommodate said bolts, said apertures adapted for securing nuts attached to said bolts.

3. The combination as set forth in claim 2 wherein:

said backplane also includes pre-drilled mounting holes for receiving said bolts.

4. The combination as set forth in claim 1, said stiffener being adapted for mounting in a channel between said rows of connectors, the maximum width of said channel being defined by the distance between said rows of connectors, said stiffener having a maximum width less than said maximum width of said channel.

5. The combination as set forth in claim 4 wherein said channel extends between said rows of connectors on the front side of said backplane.

6. The combination as set forth in claim 4 wherein said channel extends between said rows of connectors on the rear side of said backplane.

7. The combination as set forth in claim 4 wherein at least one said channel is an offset channel having a first portion of a first channel width and a second portion of second channel width, said stiffener comprising first and second segments, said first segment being of a first segment width, less than said first channel width, said second segment being of a second segment width, less than said second channel width.

8. A stiffener for a backplane comprising a rigid elongated member, the section across the longitudinal axis of said member being substantially U-shaped, said member comprising:

first and second side walls of equal height, each of said side walls having a base and a top edge; and an elongated coupling portion rigidly coupled to the top edges of the first and second side walls, such that said side walls are substantially parallel and spaced apart;

wherein said side walls have outer surfaces spaced apart by a first width in a first portion of said member and spaced apart by a second width in a second portion of said member.

9. The stiffener of claim 8 wherein the elongated coupling portion is arcuate having first and second elongated edges rigidly coupled to the top edges of the side walls.

10. The stiffener of claim 9 wherein said member further comprises a plurality of spaced-apart apertures extending through the apex of said arcuate portion, each said aperture being dimensioned to prevent rotation within said aperture of fastener means for mounting said member.

11. The stiffener of claim 8 wherein the first portion has a first longitudinal center axis between said first and second side walls, and wherein the second portion has a second longitudinal center axis between said first and second side walls, said first and second longitudinal center axes being substantially parallel.

12. The stiffener of claim 11 wherein the first and second longitudinal center axes are spaced apart.

13. The stiffener of claim 11 wherein the first and second longitudinal center axes are collinear.

14. The stiffener of claim 8 wherein said outer surface of said first side wall in said first portion and said outer surface of said first side wall in said second portion are substantially aligned.

15. The stiffener of claim 8 formed of a material selected form the group consisting of aluminum, steel, plastic, and graphite.

16. The stiffener of claim 8 wherein the member further includes a transition portion for joining the first portion and the second portion of at least one of said first and second side walls.

17. The stiffener of claim 16 wherein the transition portion comprises a bend in at least one of the first and second side walls, such that said first portion and said second portion of said at least one of said first and second side walls are substantially parallel and offset.

18. A stiffener for a backplane comprising a rigid elongated member, the section across the longitudinal axis of said member being substantially U-shaped, said member comprising:

first and second side walls of equal height, each of said side walls having a base and a top edge; and an elongated coupling portion rigidly coupled to the top edges of the first and second side walls, such that said side walls are substantially parallel and spaced apart;

wherein said member includes a first portion having a first longitudinal center axis between said first and second side walls, and a second portion having a second longitudinal center axis between said first and second side walls, said first and second longitudinal center axes being substantially parallel and offset.

19. The stiffener of claim 18 wherein said side walls have outer surfaces spaced apart by a first width in said first portion of said member and spaced apart by a second width in said second portion of said member.

20. The stiffener of claim 19 wherein said outer surface of said first side wall in said first portion and said outer surface of said first side wall in said second portion are substantially aligned.

21. The stiffener of claim 18 wherein the elongated coupling portion is arcuate having first and second elongated edges rigidly coupled to the top edges of the side walls.

22. The stiffener of claim 21 wherein said member further comprises a plurality of spaced-apart apertures extending through the apex of said arcuate portion, each said aperture being dimensioned to prevent rotation within said aperture of fastener means for mounting said member.

23. The stiffener of claim 18 formed of a material selected form the group consisting of aluminum, steel, plastic, and graphite.

24. The stiffener of claim 18 wherein the member further includes a transition portion for joining the first portion and the second portion of at least one of said first and second side walls.

25. The stiffener of claim 24 wherein the transition portion comprises a bend in at least one of the first and second side walls such that said first portion and said second portion of said at least one of said first and second side walls are substantially parallel and offset.

26. A stiffener for a backplane comprising a rigid elongated member, the section across the longitudinal axis of said member being substantially U-shaped, said member comprising:

first and second side walls, each of said side walls having a base and a top edge; and an elongated coupling portion rigidly coupled to the top edges of the first and second side walls, such that said side walls are substantially parallel and spaced apart, said coupling portion including a plurality of spaced apart mounting apertures between said first and second side walls;

wherein said side walls have outer surfaces spaced apart by a first width in a first portion of said member and spaced apart by a second width in a second portion of said member.

27. The stiffener of claim 26 wherein the elongated coupling portion is arcuate having first and second elongated edges rigidly coupled to the top edges of the side walls.

28. The stiffener of claim 27 wherein said mounting apertures extend through the apex of said arcuate portion, each said aperture being dimensioned to prevent rotation within said aperture of fastener means for mounting said member.

29. A stiffener for a backplane comprising a rigid elongated member, the section across the longitudinal axis of said member being substantially U-shaped, said member comprising:

first and second side walls, each of said side walls having a base and a top edge; and an elongated coupling portion rigidly coupled to the top edges of the first and second side walls, such that said side walls are substantially parallel and spaced apart, said coupling portion including a plurality of spaced apart mounting apertures between said first and second side walls;

wherein said member includes a first portion having a first longitudinal center axis between said first and second side walls, and a second portion having a second longitudinal center axis between said first and second side walls, said first and second longitudinal center axes being substantially parallel and offset.

30. The stiffener of claim 29 wherein said side walls have outer surfaces spaced apart by a first width in said first portion of said member and spaced apart by a second width in said second portion of said member.

31. The stiffener of claim 30 wherein said outer surface of said first side wall in said first portion and said outer surface of said first side wall in said second portion are substantially aligned.

* * * * *